(12) United States Patent
Ottens et al.

(10) Patent No.: US 7,595,496 B2
(45) Date of Patent: Sep. 29, 2009

(54) OPTIMIZED CORRECTION OF WAFER THERMAL DEFORMATIONS IN A LITHOGRAPHIC PROCESS

(75) Inventors: Joost Jeroen Ottens, Veldhoven (NL); Harmen Klaas Van Der Schoot, Vught (NL); Jeroen Pieter Starreveld, Udenhout (NL); Wouterus Johannes Petrus Maria Maas, Boxtel (NL); Willem Jurrianus Venema, Eindhoven (NL); Boris Menchtchikov, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 82 days.

(21) Appl. No.: 11/812,801

(22) Filed: Jun. 21, 2007

(65) Prior Publication Data
US 2007/0257209 A1    Nov. 8, 2007

Related U.S. Application Data

(62) Division of application No. 10/743,272, filed on Dec. 23, 2003, now Pat. No. 7,250,237.

(51) Int. Cl.
*G21K 5/00*    (2006.01)
(52) U.S. Cl. ............ 250/492.2; 250/492.1; 250/492.22; 430/30; 430/311; 438/5
(58) Field of Classification Search .............. 250/492.1, 250/492.2, 492.22; 430/30, 311; 438/5
See application file for complete search history.

(56) References Cited

U.S. PATENT DOCUMENTS

| | | | | |
|---|---|---|---|---|
| 6,087,053 A | * | 7/2000 | Hara | ............................ 430/30 |
| 6,420,717 B1 | * | 7/2002 | Babin et al. | .............. 250/492.2 |
| 6,447,964 B2 | | 9/2002 | Okino et al. | |
| 6,835,511 B2 | * | 12/2004 | Hirayanagi | ................... 430/22 |
| 6,847,433 B2 | * | 1/2005 | White et al. | ................... 355/72 |
| 7,462,429 B2 | * | 12/2008 | Menchtchikov et al. | ........ 430/30 |
| 7,462,430 B2 | * | 12/2008 | Menchtchikov et al. | ........ 430/30 |
| 2002/0053644 A1 | * | 5/2002 | Yonekawa | ............... 250/492.1 |
| 2007/0082280 A1 | * | 4/2007 | Menchtchikov et al. | ........ 430/30 |
| 2007/0090853 A1 | * | 4/2007 | Menchtchikov et al. | ..... 324/765 |

FOREIGN PATENT DOCUMENTS

| | | |
|---|---|---|
| EP | 0 877 297 | 11/1998 |
| JP | 4-192317 | 7/1992 |
| JP | 10-312957 | 11/1998 |

(Continued)

*Primary Examiner*—David A Vanore
*Assistant Examiner*—Michael Maskell
(74) *Attorney, Agent, or Firm*—Pillsbury Winthrop Shaw Pittman LLP

(57) ABSTRACT

A method and apparatus of correcting thermally-induced field deformations of a lithographically exposed substrate, is presented herein. In one embodiment, the method includes exposing a pattern onto a plurality of fields of a substrate in accordance with pre-specified exposure information and measuring attributes of the fields to assess deformation of the fields induced by thermal effects of the exposing process. The method further includes determining corrective information based on the measured attributes, and adjusting the pre-specified exposure information, based on the corrective information, to compensate for the thermally-induced field deformations. Other embodiments include the use of predictive models to predict thermally-induced effects on the fields and thermographic imaging to determine temperature variations across a substrate.

15 Claims, 13 Drawing Sheets

FOREIGN PATENT DOCUMENTS

| | | |
|---|---|---|
| JP | 11-354401 A | 12/1999 |
| JP | 2001-319872 A | 11/2001 |
| JP | 2002-015997 A | 1/2002 |
| JP | 2003-100604 A | 4/2003 |
| JP | 2005-191569 A | 7/2005 |

* cited by examiner

Translation Deformation

Magnification Deformation

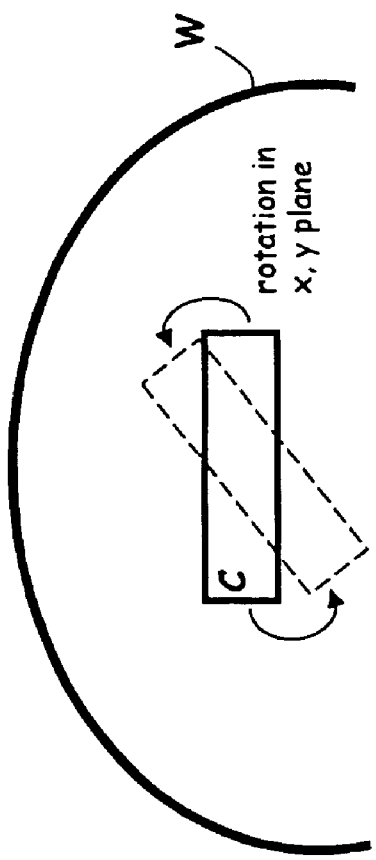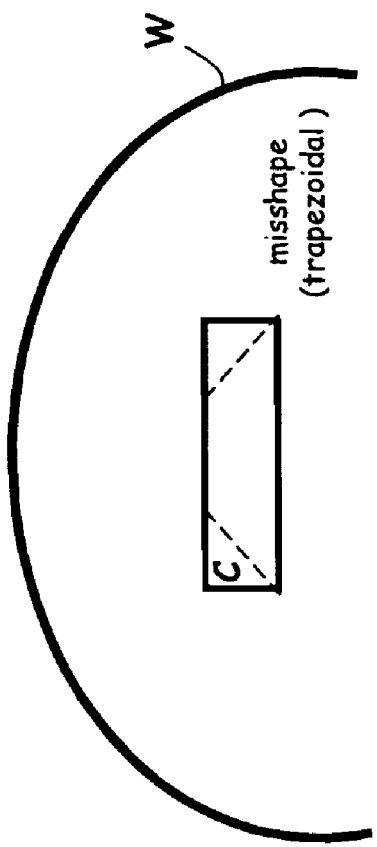
FIG. 1E
Rotational Deformation
FIG. 1F
Shape Deformation

Combination Deformation

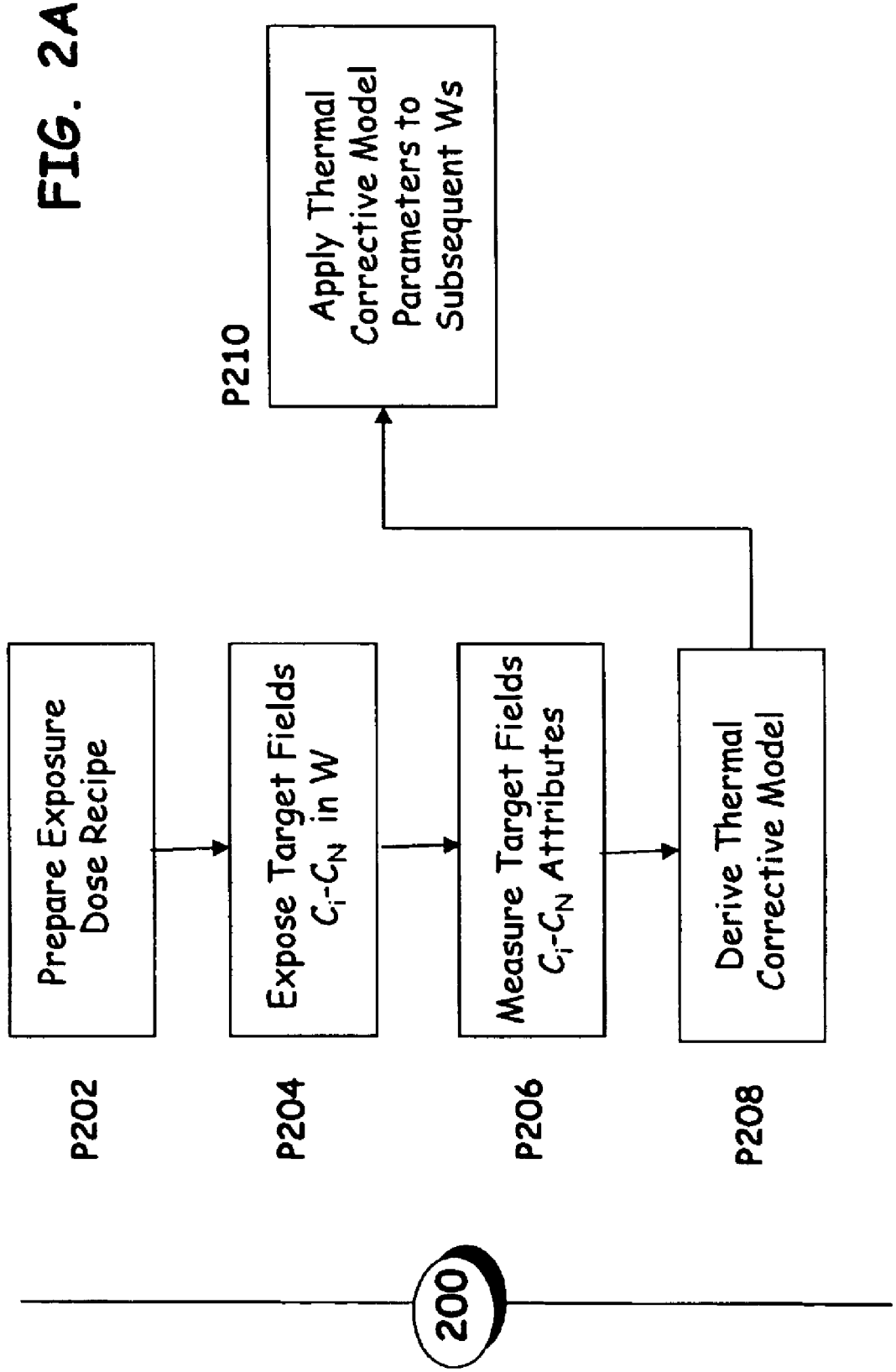

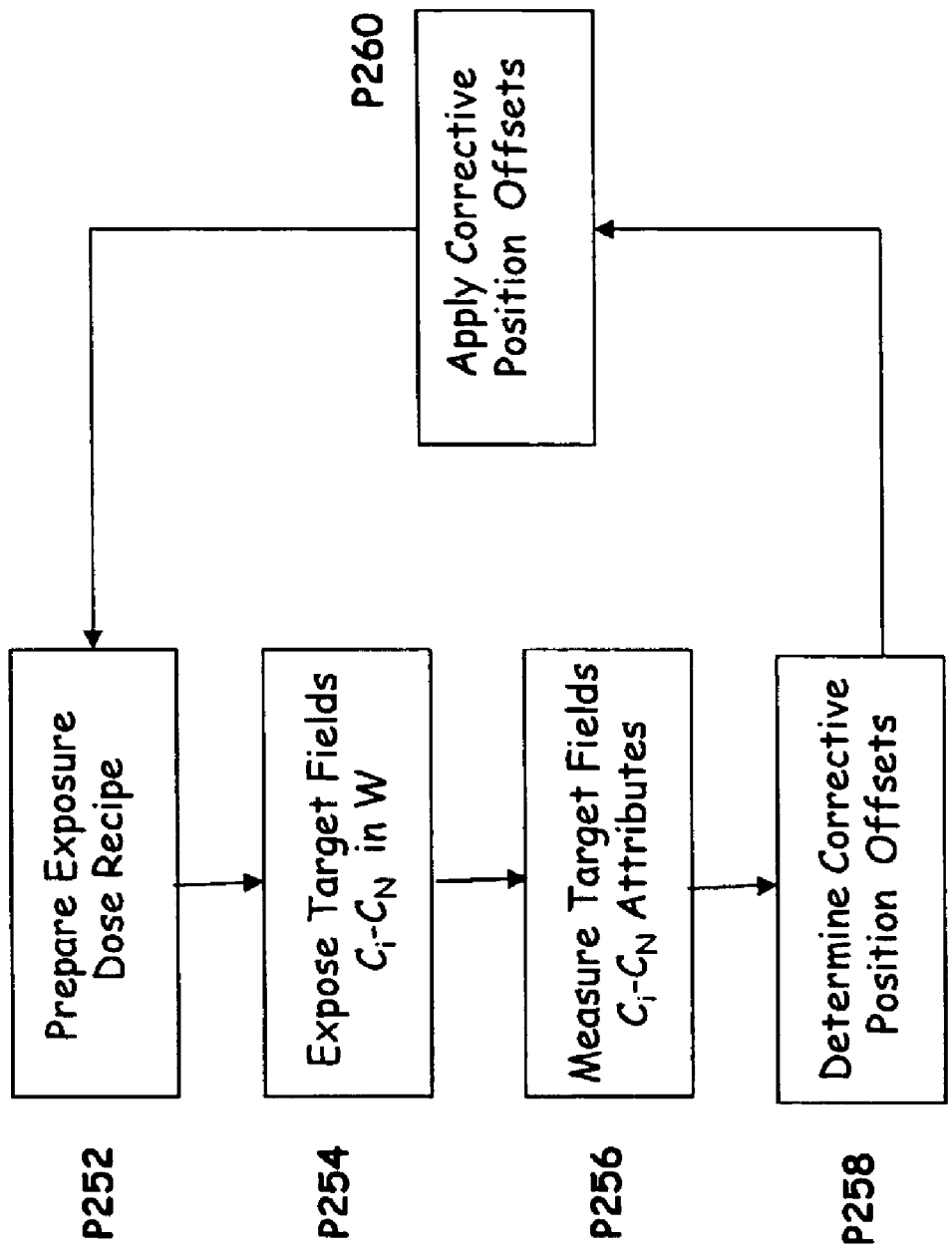

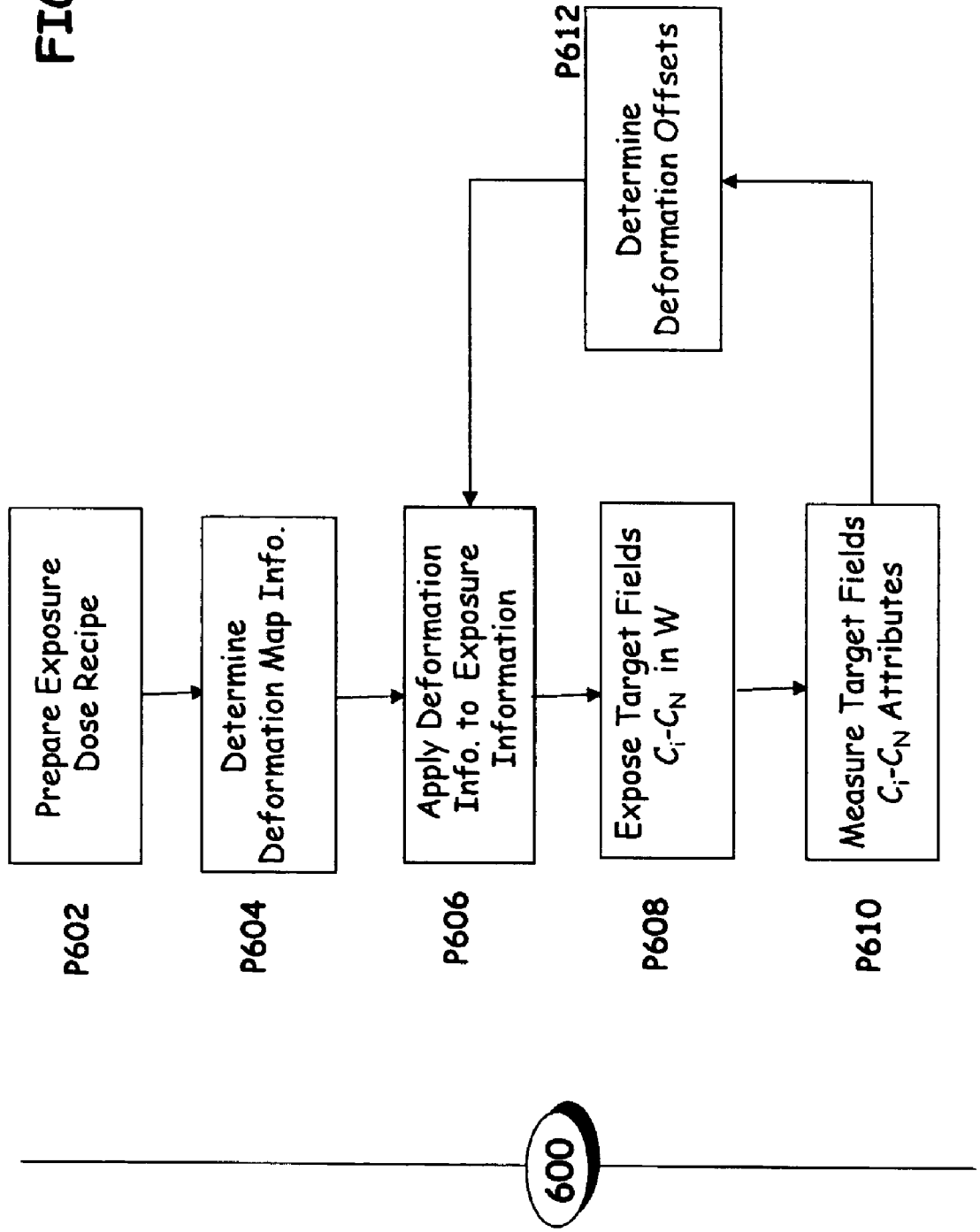

OPTIMIZED CORRECTION OF WAFER THERMAL DEFORMATIONS IN A LITHOGRAPHIC PROCESS

This application is a divisional application of U.S. patent application Ser. No. 10/743,272, filed Dec. 23, 2003 now U.S. Pat. No. 7,250,237, which application is herein incorporated in its entirety by reference.

FIELD

The present invention relates to lithographic apparatus and, more particularly, to correcting wafer substrate deformations in a lithographic apparatus.

BACKGROUND

A lithographic apparatus is a machine that applies a desired pattern onto a target portion or target field of a substrate. Lithographic apparatus can be used, for example, in the manufacture of integrated circuits (ICs). In that circumstance, a patterning device, such as a mask (i.e., reticle), may be used to generate a circuit pattern corresponding to an individual layer of the IC, and this pattern can be imaged onto a target field (e.g. comprising part of, one or several dies) on a substrate (e.g. a silicon wafer) that has a layer of radiation-sensitive material (resist).

In general, a single substrate will contain a network of adjacent target portions or fields that are successively exposed. Known lithographic apparatus include so-called "steppers," in which each target field is irradiated by exposing an entire pattern onto the target field using stationary illumination, and so-called "scanners," in which each target field is irradiated by scanning the pattern through the projection beam in a given direction (e.g., the "scanning" direction) while synchronously scanning the substrate parallel or anti-parallel to this direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion/field", respectively. The substrate referred to herein may be processed, before or after exposure, in for example a track (a tool that typically applies a layer of resist to a substrate and develops the exposed resist) or a metrology or inspection tool.

Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a projection beam with a pattern in its cross-section such as to create a pattern in a target field of the substrate. It should be noted that the pattern imparted to the projection beam may not exactly correspond to the desired pattern in the target field of the substrate. Generally, the pattern imparted to the projection beam will correspond to a particular functional layer in a device being created in the target field, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

A support structure supports (i.e. bears the weight), of the patterning device. It holds the patterning device in a way depending on the orientation of the patterning device, the design of the lithographic apparatus, and other conditions, such as, for example, whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device."

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g. water), so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

The demand for smaller and smaller semiconductor devices drives the need to have lithographic fabrication processes achieve pattern features and profiles having smaller critical dimensions ("CDs"). Moreover, as indicated above, such devices may comprise multiple layers, requiring precise positioning of successive layers over a prior layers. Needless to say, it is important that these smaller devices are consistently reproduced with as little overlay errors as possible to yield high-quality wafer substrates W.

There are, however, numerous activities during the lithographic fabrication process that contribute to overlay errors and compromise the quality of the exposed patterns. Indeed, the very lithographic exposure process used to project the pattern onto the individual target fields C may contribute to overlay errors. In particular, the energy applied to a target field C during exposure is absorbed by the wafer substrate W as thermal energy. The absorbed thermal energy may cause the target field C under exposure to deform. Such deformations may result in unacceptable overlay and focusing errors and significantly reduce yield production.

Typically, in an effort to reduce pattern shifts and wafer substrate deformations, lithographic fabrication schemes employ a correction offset procedure to determine, and compensate for, a host of processing-related errors. These procedures are based on determining parameters for an average target field $C_{ave}$ and then determining corrective offsets for the average target field $C_{ave}$. The corrective offsets are then fed back to a process control module that implements the offsets to recalibrate the various processes in order to comply with the characteristics of the average target field $C_{ave}$. However, given the variety of thermally-induced deformations that can occur during exposure, correcting such deformations based on an average target field $C_{ave}$ proves to be less than optimum—if not inadequate—for many cases.

SUMMARY

Systems, apparatuses and methods consistent with the principles of the present invention, as embodied and broadly described herein, provide for correcting substrate deformations attributable to substrate thermal effects during lithographic exposure processes. One embodiment of the present invention includes exposing a pattern onto a plurality of fields of a substrate in accordance with pre-specified exposure information and measuring attributes of the fields to assess deformation of the fields induced by thermal effects of the exposing process. The method further includes determining corrective information based on the measured attributes, and adjusting the pre-specified exposure information; based on the corrective information, to compensate for the thermally-induced field deformations.

Embodiments include empirically deriving a thermal corrective model to compensate for the deformations of target fields. Other embodiments include the use of predictive models to predict thermally-induced effects on the fields, prior to exposure. The predictive models include predicting deformation effects of selected points within each of said fields based on a thermal model and based on a time-decaying characteristic as energy is transported across said wafer.

Still other embodiments include measuring temperature variations across the substrate, prior to exposure, to provide a deformation map. The temperature variations may be measured by the use of thermographic imaging.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion/target field", respectively.

BRIEF DESCRIPTION OF THE DRAWINGS

Embodiments of the invention will now be described, by way of example only, with reference to the accompanying schematic drawings in which:

FIGS. 1C-1G illustrate various thermally-induced target field deformations;

FIG. 2A illustrates a schematic functional flow diagram depicting an embodiment of the present invention;

FIG. 2B illustrates a schematic functional flow diagram depicting another embodiment of the present invention;

FIG. 6 illustrates a schematic functional flow diagram depicting another embodiment of the present invention.

In the figures, corresponding reference symbols indicate corresponding parts.

DETAILED DESCRIPTION

As noted above, the lithographic exposure process used to project the pattern onto the individual target fields may cause the pattern shifts and deformations of the target field C as the energy applied to a target field C during exposure is absorbed by the wafer substrate W as thermal energy. These deformations may result in unacceptable overlay errors in the wafer substrate W.

As described in greater detail below, the present invention contemplates a variety of embodiments that mitigate the thermal-induced deformations in a lithographic system by taking into account the characteristics of such deformations and determining exposure correction information. Each of these embodiments then adaptively apply the exposure corrections to compensate for the deformations, resulting in the reduction of overlay errors.

Figure 1A:
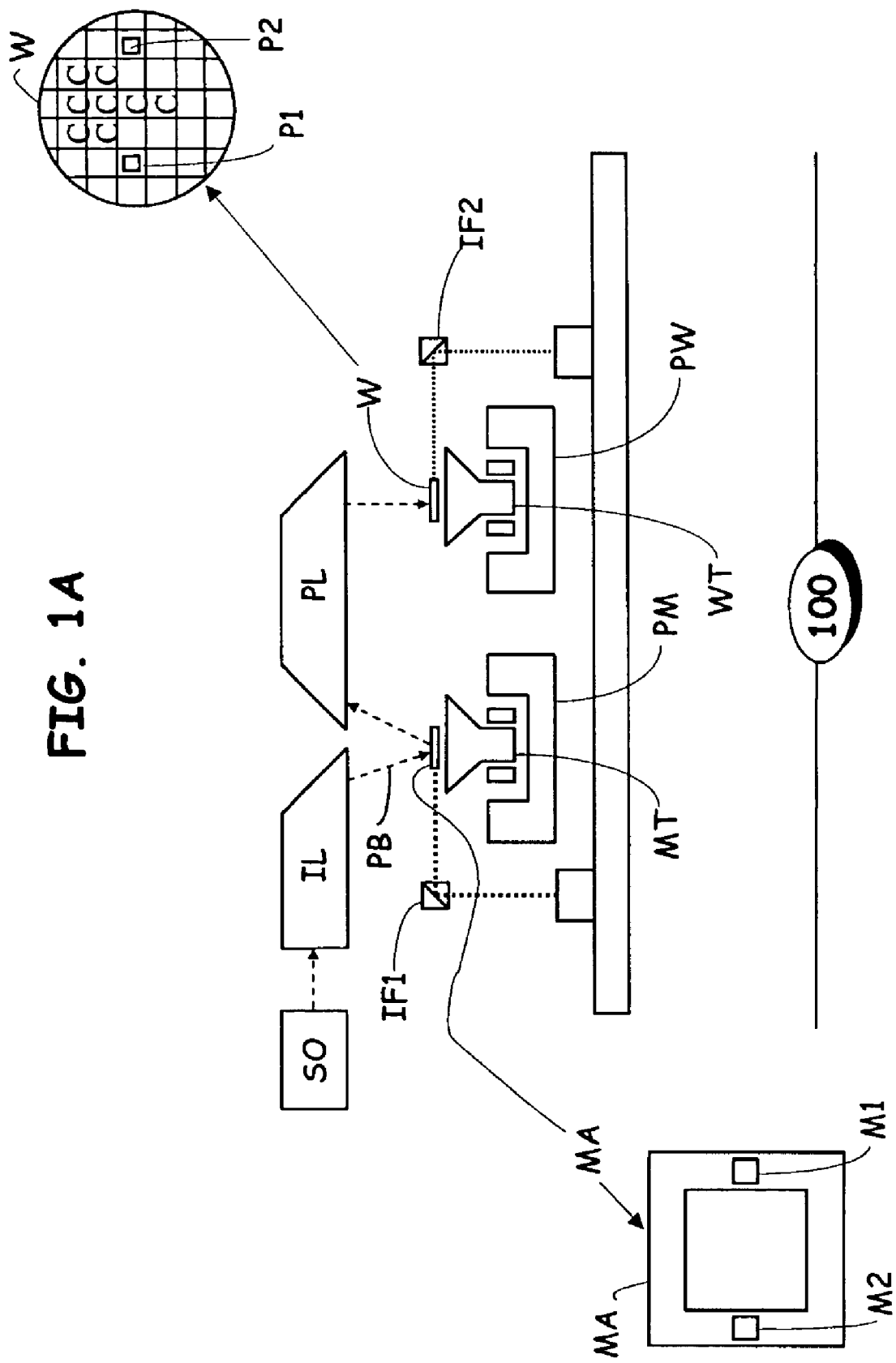
FIG. 1A depicts a lithographic apparatus according to one embodiment of the invention.

FIG. 1A schematically depicts lithographic apparatus 100 according to a particular embodiment of the invention. Lithographic apparatus 100 comprises:

an illumination system: illuminator IL for providing a projection beam PB of radiation (e.g. UV or EUV radiation);

a first support structure: (e.g. a mask table, mask holder) MT for supporting patterning device (e.g. a mask) MA and connected to first positioning mechanism PM for accurately positioning the patterning device with respect to item PL;

a substrate table: (e.g. a wafer table, wafer holder) WT for holding a substrate (e.g. a resist-coated wafer) W and connected to second positioning mechanism PW for accurately positioning the substrate with respect to item PL; and a projection system: (e.g. a reflective projection lens) PL for imaging a pattern imparted to the projection beam PB by patterning device MA onto a target field C (e.g. comprising one or more dies) of the substrate W.

As depicted in FIG. 1A, lithographic apparatus 100 is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and lithographic apparatus 100 may be separate entities, for example when the source is a plasma discharge source. In such cases, the source is not considered to form part of lithographic apparatus 100 and the radiation beam is generally passed from the source SO to the illuminator IL with the aid of a radiation collector comprising for example suitable collecting mirrors and/or a spectral purity filter. In other cases the source may be integral part of apparatus 100, for example when the source is a mercury lamp. The source SO and the illuminator IL, may be referred to as a radiation system.

The illuminator IL may comprise adjusting mechanisms for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target field C of the substrate W. With the aid of the second positioning mechanism PW and position sensor IF2 (e.g. an interferometric device), the substrate table WT can be moved accurately, e.g. so as to position different target fields C in the path of the beam PB. Similarly, the first positioning mechanism PM and position sensor IF1 can be used to accurately position the mask MA with respect to the path of the beam PB, e.g. after mechanical retrieval from a mask library, or during a scan. In general, movement of the object tables MT and WT may be realized with the aid of a long-stroke module and a short-stroke module, which form part of the positioning mechanism PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

Lithographic apparatus 100 can be used in the following preferred modes:

step mode: mask table MT and the substrate table WT are kept essentially stationary, while an entire pattern imparted to the projection beam is projected onto a target fields C in one go (i.e. a single static exposure). The substrate table WT is then shifted in the X and/or Y direction so that a different target field C can be exposed. In step mode, the maximum size of the exposure field limits the size of the target field C imaged in a single static exposure.

scan mode: the mask table MT and the substrate table WT are scanned synchronously while a pattern imparted to the projection beam is projected onto a target field C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target field in a single dynamic exposure, whereas the length of the scanning motion determines the height (in the scanning direction) of the target field C.

other mode: the mask table MT is kept essentially stationary holding a programmable patterning device, and the substrate table WT is moved or scanned while a pattern imparted to the projection beam is projected onto a target field C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed by lithographic apparatus 100.

Figure 1B:
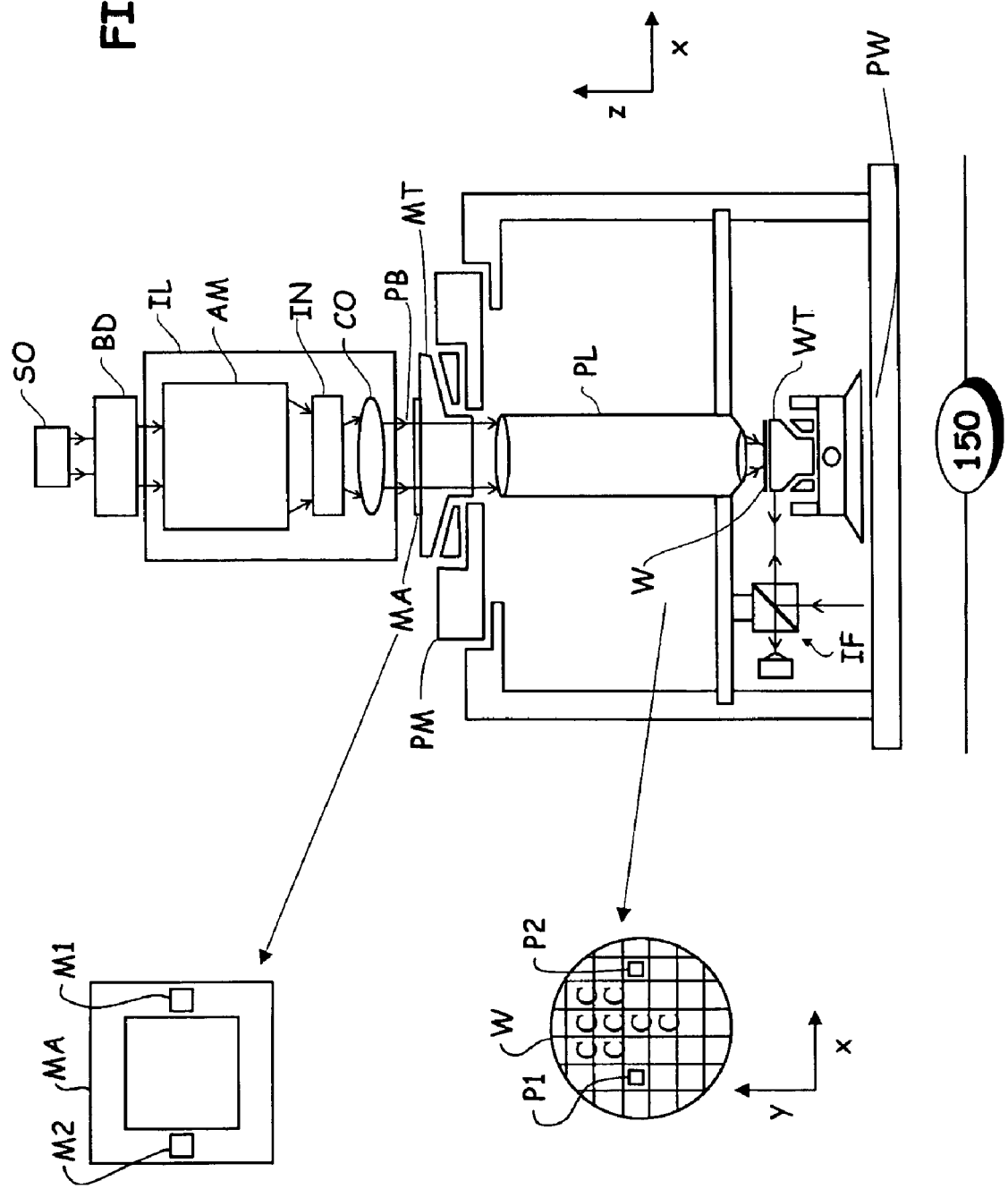
FIG. 1B depicts a lithographic apparatus according to one embodiment of the invention.
Figure 1C:
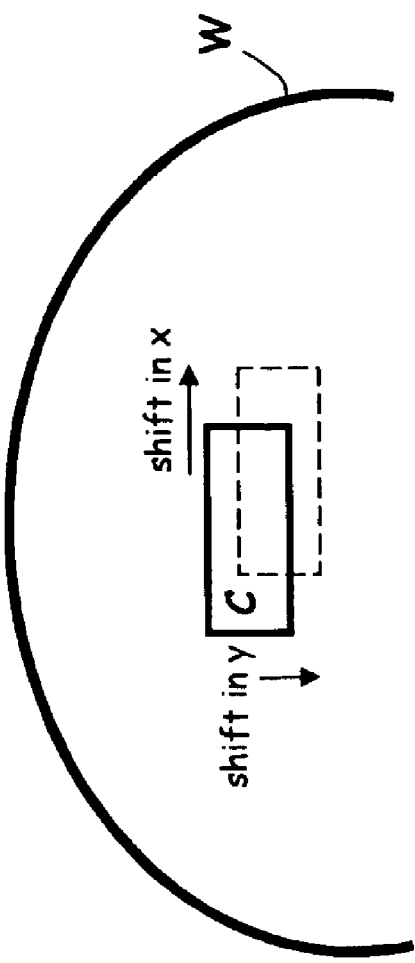
Figure 1D:
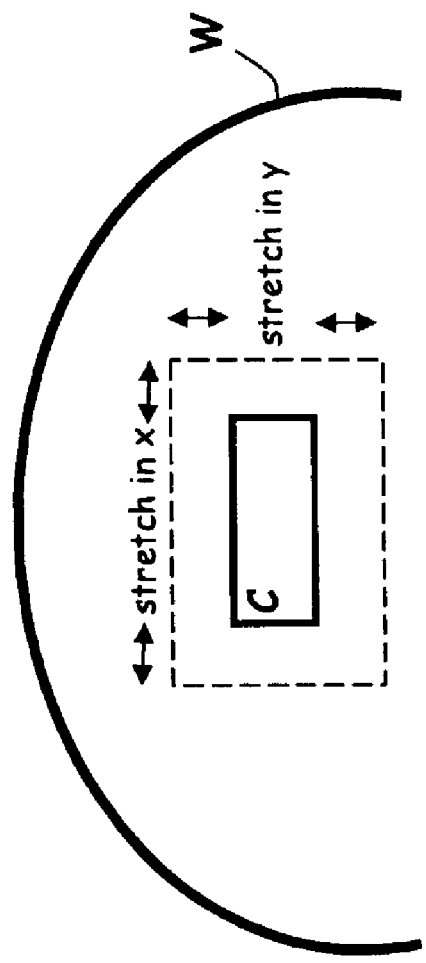
Figure 16:
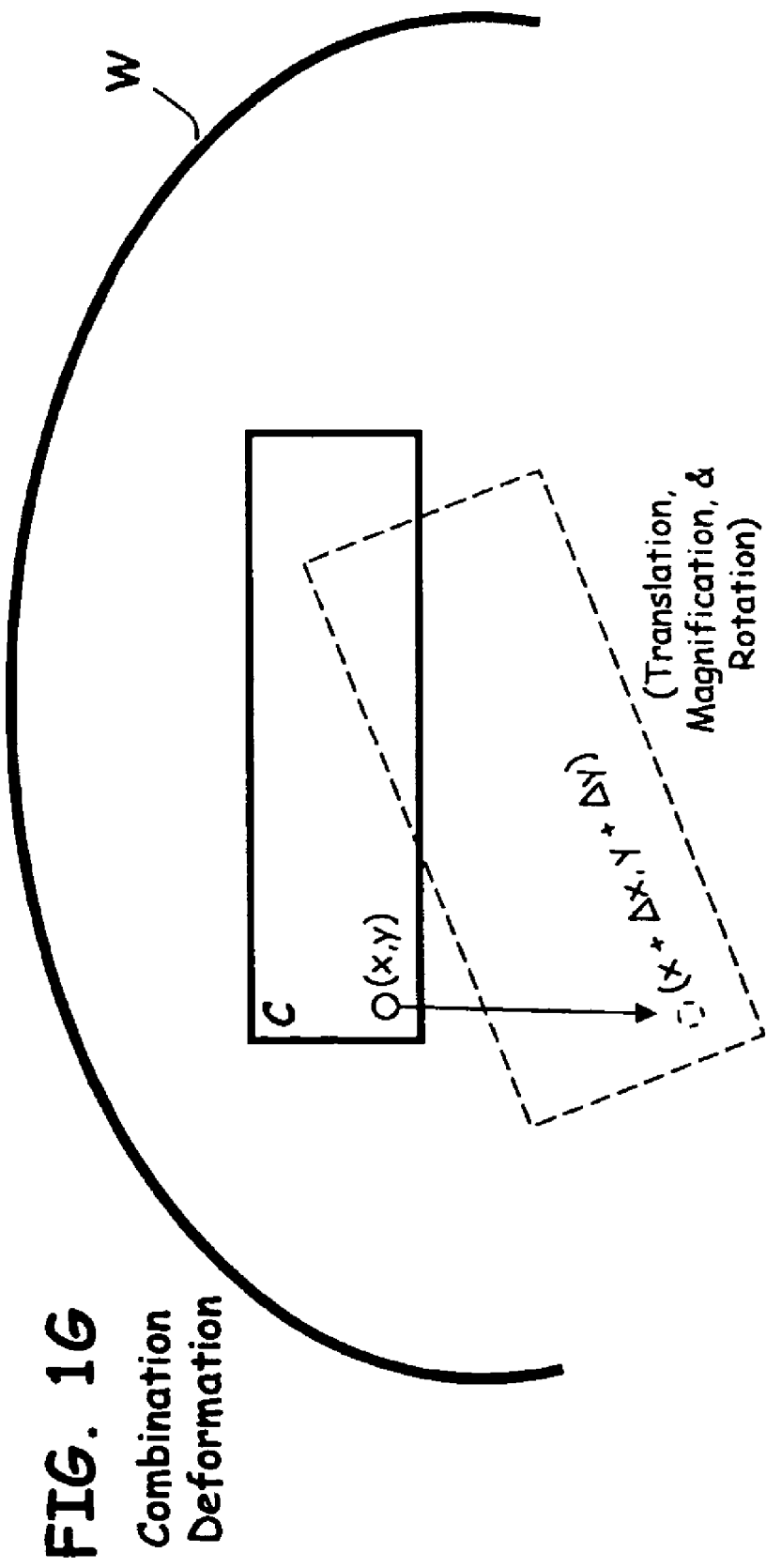

As noted above, the lithographic apparatus may be configured as a transmissive type apparatus (e.g. employing a transmissive mask). FIG. 1B schematically depicts lithographic apparatus 150 having a transmissive configuration, comprising:

an illumination system: illuminator IL for providing a projection beam PB of radiation (e.g. UV radiation or other radiation).

a first support structure: (e.g. a mask table, mask holder) MT for supporting patterning device (e.g. a mask) MA and connected to first positioning mechanism PM for accurately positioning the patterning device with respect to item PL;

a substrate table: (e.g. a wafer table, wafer holder) WT for holding a substrate (e.g. a resist-coated wafer) W and connected to second positioning mechanism PW for accurately positioning the substrate with respect to item PL; and a projection system: (e.g. a refractive projection lens) PL for imaging a pattern imparted to the projection beam PB by patterning device MA onto a target field C (e.g. comprising one or more dies) of the substrate W.

The illuminator IL receives a beam of radiation from a radiation source SO. The source and lithographic apparatus 150 may be separate entities, for example when the source is an excimer laser. In such cases, the source is not considered to form part of lithographic apparatus 150 and the radiation beam is passed from the source SO to the illuminator IL with the aid of a beam delivery system BD comprising for example suitable directing mirrors and/or a beam expander. In other cases the source may be integral part of apparatus 150, for example when the source is a mercury lamp. The source SO and the illuminator IL, together with the beam delivery system BD if required, may be referred to as a radiation system.

The illuminator IL may comprise adjusting mechanism AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target field C of the substrate W. With the aid of the second positioning mechanism PW and position sensor IF (e.g. an interferometric device), the substrate table WT can be moved accurately, e.g. so as to position different target fields C in the path of the beam PB. Similarly, the first positioning mechanism PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT may be realized with the aid of a long-stroke module and a short-stroke module, which form part of the positioning mechanism PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

Lithographic apparatus 150 can be used in the following preferred modes:

step mode: the mask table MT and the substrate table WT are kept essentially stationary, while an entire pattern imparted to the projection beam is projected onto a target field C in one sweep (i.e. a single static exposure). The substrate table WT is then shifted in the X and/or Y direction so that a different target field C can be exposed. In step mode, the maximum size of the exposure field limits the size of the target field C imaged in a single static exposure.

scan mode: the mask table MT and the substrate table WT are scanned synchronously while a pattern imparted to the projection beam is projected onto a target field C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target field C in a single dynamic exposure, whereas the length of the scanning motion determines the height (in the scanning direction) of the target field C.

other mode: the mask table MT is kept essentially stationary holding a programmable patterning device, and the substrate table WT is moved or scanned while a pattern imparted to the projection beam is projected onto a target field C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed by lithographic apparatus 150.

As discussed above, the lithographic exposure process may contribute to overlay errors in the wafer substrate W by causing thermally-induced deformations and pattern shifts in the exposed target fields C. Typically, as target field $C_i$ is exposed, it absorbs thermal energy and heats up locally in a manner that depends on the thermal properties of the wafer substrate W, such as absorption, radiation, conduction, etc. As such, the exposure of target field $C_i$ may also heat up the adjacent target fields $C_{i+k}$ surrounding target field $C_i$. As the successive, adjacent target field $C_{i+1}$ is subsequently exposed, the preceding target field $C_i$ proceeds to cool down, but may also experience some residual heating due to the exposure of target field $C_{i+1}$.

The numerous heating and cooling episodes experienced by the target fields C as well as the thermal properties of the wafer substrate W may cause a host of target field deformities. These target field deformations may occur in the form of translation deformations (see, FIG. 1C), magnification deformations (see, FIG. 1D), rotational deformations (see, FIG. 1E), shape deformations (see, FIG. 1F), and/or any combination thereof (see, FIG. 1G).

First Embodiment

FIG. 2A schematically depicts the general inventive concept of thermal correction process 200, constructed and operative in accordance with a particular embodiment of the present invention. As indicated in FIG. 2A, correction process 200 commences with procedure task P202, which provides the initial exposure recipe. The exposure recipe designates the amount of energy to be focused by the projection beam PB onto each of the target fields $C_i$-$C_N$ of the wafer substrate W to comply with the manufacturer's specified features and profile of the exposed pattern. It will be appreciated that, for some embodiments, it is desirable to maintain the total energy dose received by the target fields $C_i$-$C_N$ of the wafer substrate W constant. However, even in these embodiments, the exposure time (i.e., scanning speed) and exposure energy (e.g., laser power) may be configured as adjustable parameters in the exposure recipe, provided that the total energy dose remains constant, in order to reduce thermal effects.

The exposure recipe may also include associated exposure position information that identifies the pre-specified coordinates at which the projection beam PB is to be focused for the area of each target fields $C_i$-$C_N$. The exposure recipe may further include associated exposure sequence information that identifies the pre-specified sequence in which each of the target fields $C_i$-$C_N$ are to be exposed by projection beam PB.

Thermal correction process 200 then advances to procedure task P204, where the target fields $C_i$-$C_N$ of wafer substrate W are successively exposed with the desired pattern by lithographic apparatus 100, 150, in a manner consistent with the description above and in accordance with the exposure recipe including exposure time, exposure energy, exposure coordinate positioning, and exposure sequencing.

After exposure, correction process 200 then progresses to procedure task P206, where the exposed wafer substrate W is subjected to a measurement process. The measurement process is configured to measure various attributes and artifacts of the target fields $C_i$-$C_N$ and/or wafer substrate W that evince wafer heating effects. Such measured attributes may include, for example, the size of the individual target fields C, specific test patterns, layer dependent alignment marks, gaps between target field C features, X and/or Y diameter of target fields holes and/or posts, ellipticity of target fields holes and/or posts, area of target field features, width at the top of a feature, width at the middle of a feature, width at the bottom of a feature, feature sidewall angle, etc.

Some of these measurements may be performed internally; that is, measured by employing various mechanisms within lithographic exposure apparatus 100, 150, such as, for example, the combination of alignment sensors and markers or a dedicated sensor configured for such purposes. Alternatively, these measurements may be performed by external devices, such as, for example, a scanning electron microscope (SEM), spectroscopic ellipsometer, reflectometer, electric line width measurement (ELM), focused ion beam (FIB), e-Beam, atomic force microscope (AFM), scatterometer, defect inspection tool, overlay measurement tool, or other tools suitable for such purposes.

Based on the measured attributes of the exposed target fields $C_i$-$C_N$ in procedure task P208, thermal correction process 200 empirically derives a thermal corrective model to compensate for the deformations of target fields $C_i$-$C_N$. The thermal corrective model may be characterized by:

$$\Delta \vec{r} \approx \Sigma T_i D_i; \text{ where} \quad (1)$$

$$T_i = T_i^j(t, t_i, \overline{C}); \text{ and} \quad (2)$$

$$D_i = D_i(\vec{r}, \vec{r}_i, \overline{G}) \quad (3)$$

$T_i$: represents the thermal effects of exposing a target field $C_i$, where t is the current time, $t_i$ is the time of exposing target field $C_i$, and $\overline{C}=(c_1, c_2, \ldots, c_n)$ represents a vector of calibrated parameters that correspond to the thermal properties of the lithographic exposure components with respect to time;

$D_i$: represents the effects induced by a distance between the exposed target field $C_i$ and the target field to be currently exposed, where $\vec{r}$ is the point of a wafer substrate W currently being exposed, $\vec{r}_i$ is a point on target field $C_i$, and $\overline{G}=(g_1, g_2, \ldots, g_m)$ represents a vector of calibrated parameters that corresponds to the thermal properties of the lithographic exposure components with respect to distance.

In one embodiment, $T_i$ may take the form of a time-decaying function, such as, for example, $$T_i = e^{\frac{t-t_i}{\tau}}$$

where $C \equiv \tau$. In other words, $\tau$ represents the time sensitivity constant which depends on the thermal properties of the lithographic exposure components. Similarly, $D_i$ may take the form of distance-decaying function, such as, $D_i = ke^{-|\vec{r}_i - \vec{r}|/\chi}$ where $\overline{G} \equiv \chi$. That is, $\chi$ represents the spatial thermal properties of the lithographic exposure components.

It will be appreciated that procedure tasks P202-P208 may be iterated numerous times until the measured attributes of the exposed target fields $C_i$-$C_N$ reach a predefined threshold level of quality. Thermal correction process 200, then applies the derived thermal corrective model by feed-forwarding the corresponding thermal corrective parameters to the exposure processing of subsequent wafer substrates W. For example, the corresponding parameters may be applied to the exposure recipe to adjust the exposure time, exposure energy, exposure coordinate positioning, and exposure sequencing in a manner consistent with the derived thermal corrective model.

Second Embodiment

FIG. 2B schematically depicts the general inventive concept of thermal correction process 250, constructed and operative in accordance with a particular embodiment of the present invention. As indicated in FIG. 2B, correction process 250 commences with procedure task P252, which provides the initial exposure recipe. As discussed above, the exposure recipe may include exposure time, exposure energy, exposure coordinate positioning, and exposure sequencing information.

Thermal correction process 250 then advances to procedure task P254, where the target fields $C_i$-$C_N$ of wafer substrate W are successively exposed with the desired pattern by lithographic apparatus 100, 150, in a manner consistent with the description above and in accordance with the exposure recipe.

After exposure, correction process 250 then progresses to procedure task P256, where the exposed wafer substrate W is subjected to a measurement process. The measurement process is configured to measure various attributes and artifacts of the target fields $C_i$-$C_N$ and/or wafer substrate W that evince wafer heating effects. Such measured attributes may include, for example, the size of the individual target fields C, specific test patterns, layer dependent alignment marks, gaps between target field C features, X and/or Y diameter of target fields holes and/or posts, X and/or Y diameter of target fields holes and/or posts, ellipticity of target fields holes and/or posts, area of target field features, width at the top of a feature, width at the middle of a feature, width at the bottom of a feature, feature sidewall angle, etc.

Some of these measurements may be performed internally; that is, measured by employing various mechanisms within lithographic exposure apparatus 100, 150, such as, for example, the combination of alignment sensors and markers or a dedicated sensor configured for such purposes. Alternatively, these measurements may be performed by external devices, such as, for example, a scanning electron microscope (SEM), spectroscopic ellipsometer, reflectometer, electric line width measurement (ELM), focused ion beam (FIB), e-Beam, atomic force microscope (AFM), scatterometer, defect inspection tool, overlay measurement tool, or other tools suitable for such purposes.

Based on the measured attributes of the exposed target fields $C_i$-$C_N$ in procedure task P258, thermal correction process 250 determines thermal corrective information to compensate for the non-uniformities and deformations of target fields $C_i$-$C_N$. In this embodiment, the thermal corrective information takes the form of corrective exposure position offsets. That is, during exposure, the projection beam PB is focused at pre-specified coordinate for each target field $C_i$-$C_N$. Because the target field deformations are based, at least in part, on the manner in which the target field $C_i$ exposure coordinate responds locally to the thermal energy as well as the residual thermal energy absorbed by adjacent target fields $C_{i+k}$ surrounding target field $C_i$, adjusting the exposure coordinates for each target field $C_i$-$C_N$ reduces the generation of target field deformations. As such, thermal corrective process 250, in procedure task P258, calculates the corrective exposure position offsets for each target field $C_i$-$C_N$ in order to minimize the thermally-induced target field deformations.

Thermal correction process 250, then applies these corrective position offsets by feeding the offsets back to the exposure recipe to revise and update the associated exposure coordinate information, as indicated in procedure task P260. Alternative revisions may include adjustments to the exposure time, exposure energy, and exposure sequencing as discussed above. Process 250 may be iterated several times until the exposed patterns achieve the features and profile specified by manufacturer.

Third Embodiment

Figure 3:
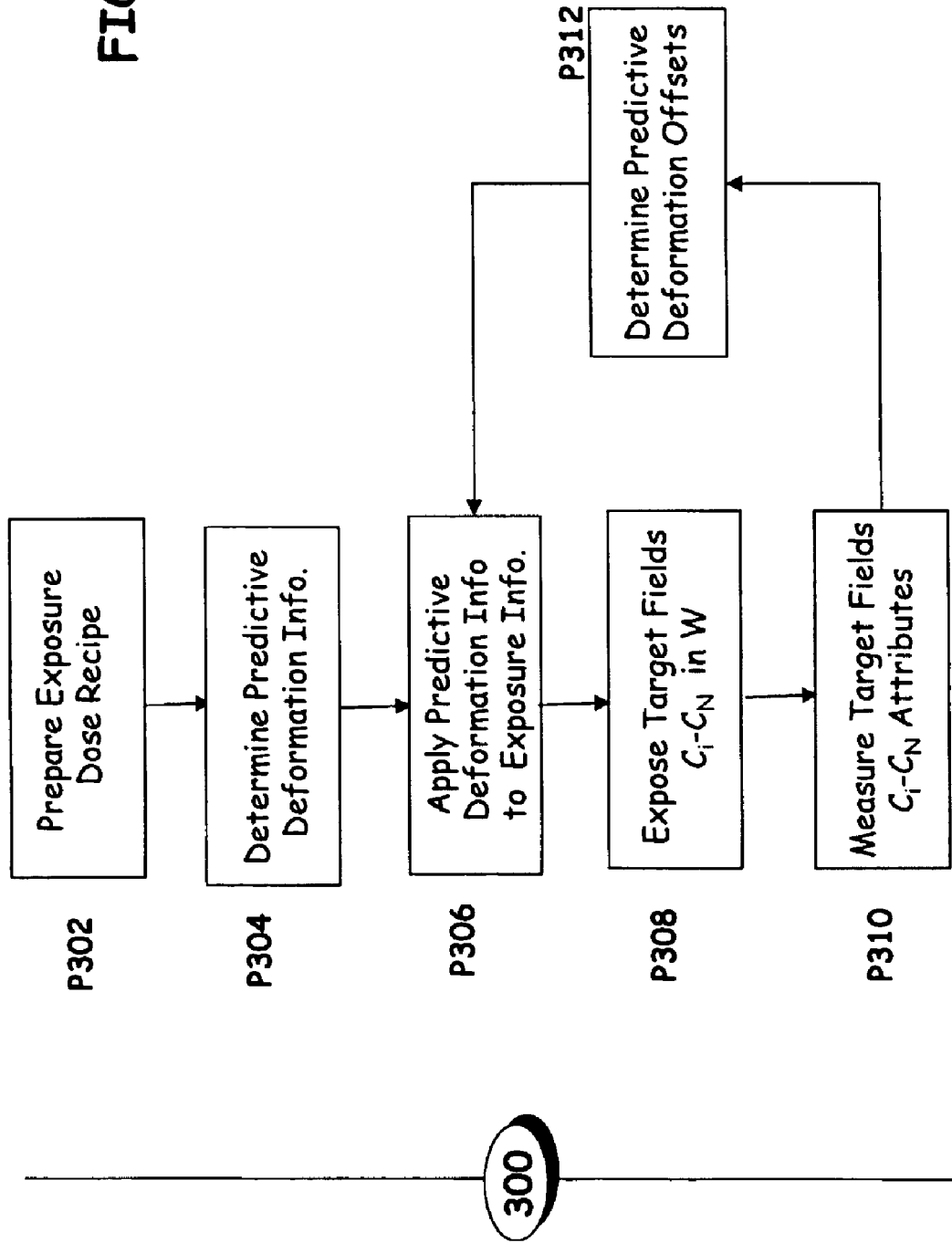
FIG. 3 illustrates a schematic functional flow diagram depicting another embodiment of the present invention.

FIG. 3 schematically depicts the general inventive concept of thermal correction process 300, constructed and operative in accordance with a particular embodiment of the present invention. As indicated in FIG. 3, correction process 300 commences with procedure task P302, which provides the initial exposure recipe. As discussed above with respect to the other disclosed embodiments, the exposure recipe may include exposure time, exposure energy, exposure coordinate positioning, and exposure sequencing information.

Thermal correction process 300 then advances to procedure task P304, where thermal corrections are determined. In this embodiment, the thermal corrective information takes the form of predictive deformation information based on a global expansion model. In particular, as depicted in FIG. 1G, for example, the deformation due to thermal effects of a selected point (x,y) within the area of each target field $C_i$ may be modeled as: $(x+\Delta x, y+\Delta y)$, where $\Delta x$, $\Delta y$ represent the actual deformation of the target field points along the x and y directions, respectively. The actual deformation may include translation, magnification, rotation effects and combinations thereof.

The actual x, y deformations, $\Delta x$, $\Delta y$, may be approximated by predicted deformation $(dx_p, dy_p,)$, which are calculated as follows:

$$[dx]_p = \left[\frac{x}{r_w} \cdot \frac{N_i}{N_{tot}} \cdot dx_{max}\right]; \text{ and} \quad (4)$$

$$[dy]_p = \left[\frac{y}{r_w} \cdot \frac{N_i}{N_{tot}} \cdot dy_{max}\right]; \text{ where} \quad (5)$$

$dx_p$: represents the predicted deformation along the x axis;
$dx_{max}$: represents the predicted total deformation of the wafer substrate W in the x direction after the last target field has been exposed;
x: represents the x coordinate of a point on the wafer substrate W;
$r_w$: represents the radius of the wafer substrate W;
$N_i$: represents the current target field index number;
$N_{tot}$: represents the total number of target fields;
$dy_p$: represents the predicted deformation along the y axis;
$dy_{max}$: represents the predicted total deformation of the wafer substrate W in the y direction after the last target field has been exposed; and
y: represents the y coordinate of a point on the wafer substrate W.

In this manner, each selected point (x,y) within the area of each target field $C_i$ may be predicted to deform into: $(x+dx_p, y+dy_p)$. As such, procedure task P304 calculates the set of predictive deformations $(x+dx_p, y+dy_p)$ for a plurality of selected points of each target field $C_i$.

Thermal correction process 300 then advances to procedure task P306, where the set of calculated predictive deformation information is applied to the exposure information of the exposure recipe to compensate for the predicted deformations. In other words, by having a prediction as to how the selected points of each target field $C_i$ will deform in response to the local and residual thermal energy absorbed by target field $C_i$ during exposure, the predicted deformation information may be used to adjust the exposure information for each target field $C_i$-$C_N$ in order to reduce the chances of generating target field deformations. The adjusted exposure information may include calculating exposure position offsets to adjust exposure coordinate positions, or other adjustable exposure parameters.

After applying the predictive position offsets, process 300 in procedure task P308, successively exposes each of the target fields $C_i$-$C_N$ with the desired pattern via lithographic apparatus 100, 150, in a manner consistent with the description above and in accordance with the exposure recipe, including exposure time, exposure energy, exposure coordinate positioning, and exposure sequencing information.

After exposure, correction process 300 then progresses to procedure task P310, where the exposed wafer substrate W is subjected to a measurement process. The measurement process is configured to measure various attributes and artifacts of the target fields $C_i$-$C_N$ and/or wafer substrate W that evince wafer heating effects. As discussed above, such measured attributes may include the size of the individual target fields C, specific test patterns, layer dependent alignment marks, gaps between target field C features, X and/or Y diameter of target fields holes and/or posts, etc. and may be performed by mechanisms internal to lithographic exposure apparatus 100, 150, or by external devices.

Based on the measured attributes of the exposed target fields $C_i$-$C_N$ in procedure task P312, thermal correction process 300 determines offset information to revise the predictive deformation information $(x+dx_p, y+dy_p)$. That is, armed with the measured attribute information, equations (4), (5) may be re-calculated to generate an updated set of predictive deformations for a plurality of selected points within each target field $C_i$. The predictive deformation information offsets may be fed back to the exposure recipe to revise and update the exposure information, such as, for example, exposure time, exposure energy, exposure coordinate positioning, and exposure sequencing information. Process 300 may be iterated several times until the exposed patterns achieve the features and profile specified by manufacturer.

Fourth Embodiment

Figure 4A:
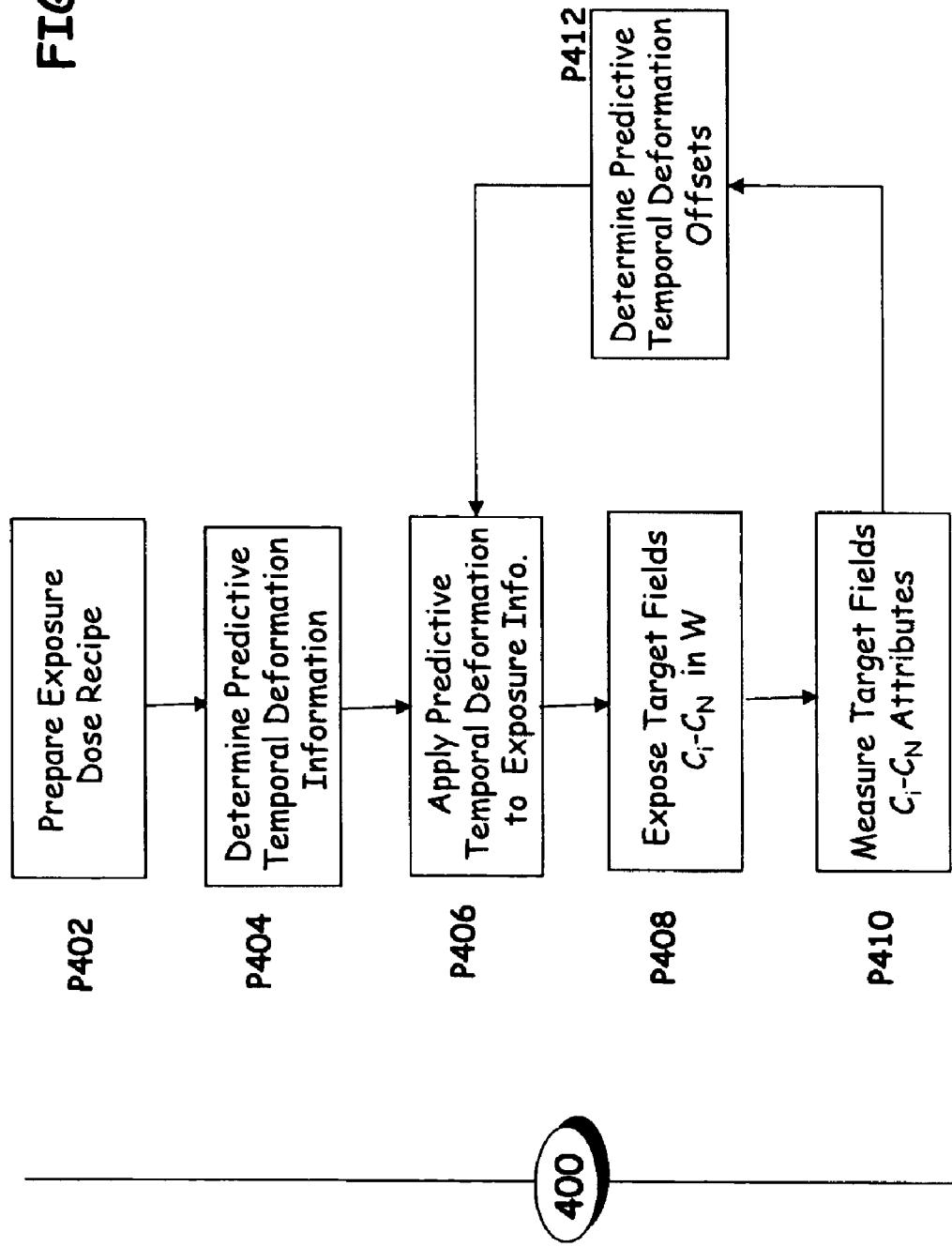
FIGS. 4A-4B illustrate a schematic functional flow diagram depicting another embodiment of the present invention.

FIG. 4A schematically depicts the general inventive concept of thermal correction process 400, constructed and operative in accordance with a particular embodiment of the present invention. As indicated in FIG. 4A, correction process 400 commences with procedure task P402, which provides the initial exposure recipe. As discussed above with respect to the other disclosed embodiments, the exposure recipe may include exposure time, exposure energy, exposure coordinate positioning, and exposure sequencing information.

Thermal correction process 400 then advances to procedure task P404, where thermal corrections are determined. In this embodiment, the thermal corrective information takes the form of predictive thermal deformation information. In particular, local deformations are significantly effected by the energy applied on previously-exposed dies. Such effects may be modeled as:

$$\Delta \bar{r} \approx \sum_i T_i D_i; \text{ where} \quad (6)$$

$\Delta r$: represents the predictive time-dependent deformation effects;

$$T_i = e^{\frac{t-t_i}{\tau}}:$$

represents the thermal effects of exposing a target field $C_i$ (i.e., die), which will decay in time as energy is transported across the wafer substrate W $\tau$: represents the time sensitivity constant which depends on the thermal properties of the lithographic exposure components;
$D_i = ke^{-|\bar{r}_i - \bar{r}|/\chi}$: represents the effects induced by a distance $r_i$ between the exposed target field $C_i$ and the target field to be currently exposed;
$\chi$: represents the spatial thermal properties of the lithographic exposure components; and
k: represents a proportionality constant which depends on the thermal properties of the lithographic exposure components (e.g., exposure chuck, wafer processing, etc.) but will generally be constant for a given set of components.

Figure 4B:
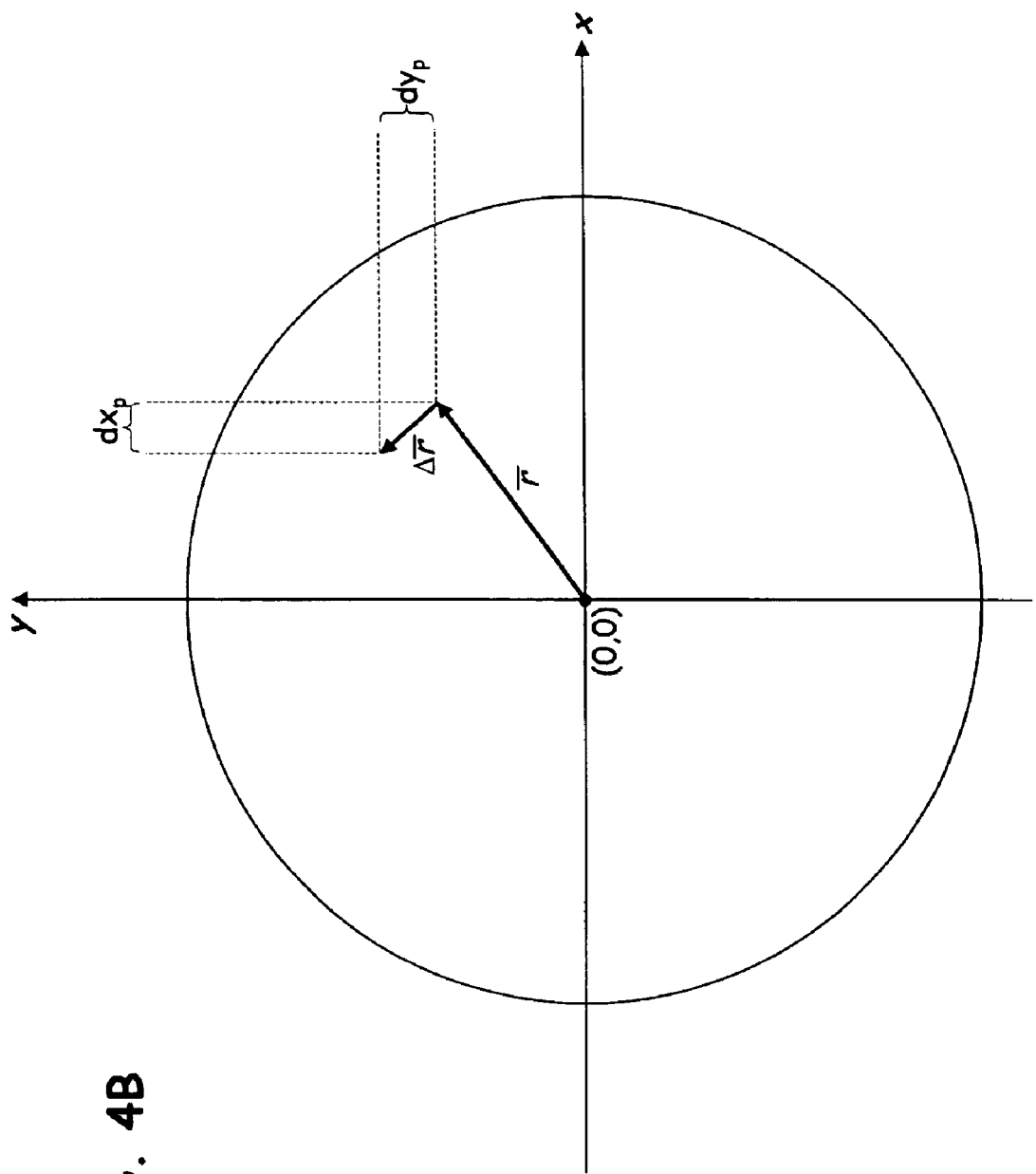

As indicated in FIG. 4B, because $\Delta r=(dx_p, dy_p)$, equation (3) may be expressed in terms of its x, y components, which may be calculated to provide a set of calculated predictive temporal deformation information, as follows:

$$dx_p = \Sigma_i T_i^x D_i^x; \tag{7a}$$

$$dy_p = \Sigma_i T_i^y D_i^y \tag{7b}$$

Thermal correction process 400 then advances to procedure task P406, where the set of calculated predictive temporal deformation information is applied to the exposure information of the exposure recipe to compensate for the predicted deformations. In other words, by having a prediction as to how thermal effects deform a target field $C_i$ as energy is transported across the wafer substrate W, the predicted deformation information may be used to adjust the exposure information for each target field $C_i$-$C_N$ in order to reduce the chances of generating target field deformations. The adjusted exposure information may include calculating exposure position offsets to adjust exposure coordinate positions or other adjustable exposure parameters.

After applying the predictive position offsets, process 400 in procedure task P408, successively exposes each of the target fields $C_i$-$C_N$ with the desired pattern via lithographic apparatus 100, 150, in a manner consistent with the description above and in accordance with the exposure recipe, including applied dosages, exposure coordinate positioning, and exposure sequencing.

After exposure, correction process 400 then progresses to procedure task P410, where the exposed wafer substrate W is subjected to a measurement process. The measurement process is configured to measure various attributes and artifacts of the target fields $C_i$-$C_N$ and/or wafer substrate W that evince wafer heating effects. As discussed above, such measured attributes may include, for example, the size of the individual target fields C, specific test patterns, layer dependent alignment marks, gaps between target field C features, X and/or Y diameter of target fields holes and/or posts, etc. and may be performed by mechanisms internal to lithographic exposure apparatus 100, 150, or by external devices.

Based on the measured attributes of the exposed target fields $C_i$-$C_N$ in procedure task P412, thermal correction process 300 determines offset information to revise the predictive temporal deformation information ($dx_p$, $dy_p$). That is, armed with the measured attribute information, equations (4a), (4b) may be re-calculated to generate an updated set of predictive deformations for a plurality of selected points within each target field $C_i$. The predictive deformation information offsets may be fed back to the exposure recipe to revise and update the exposure information, such as, for example, exposure times, exposure sequencing, exposure coordinate information. Process 400 may be iterated several times until the exposed patterns achieve the features and profile specified by manufacturer.

Fifth Embodiment

Figure 5A:
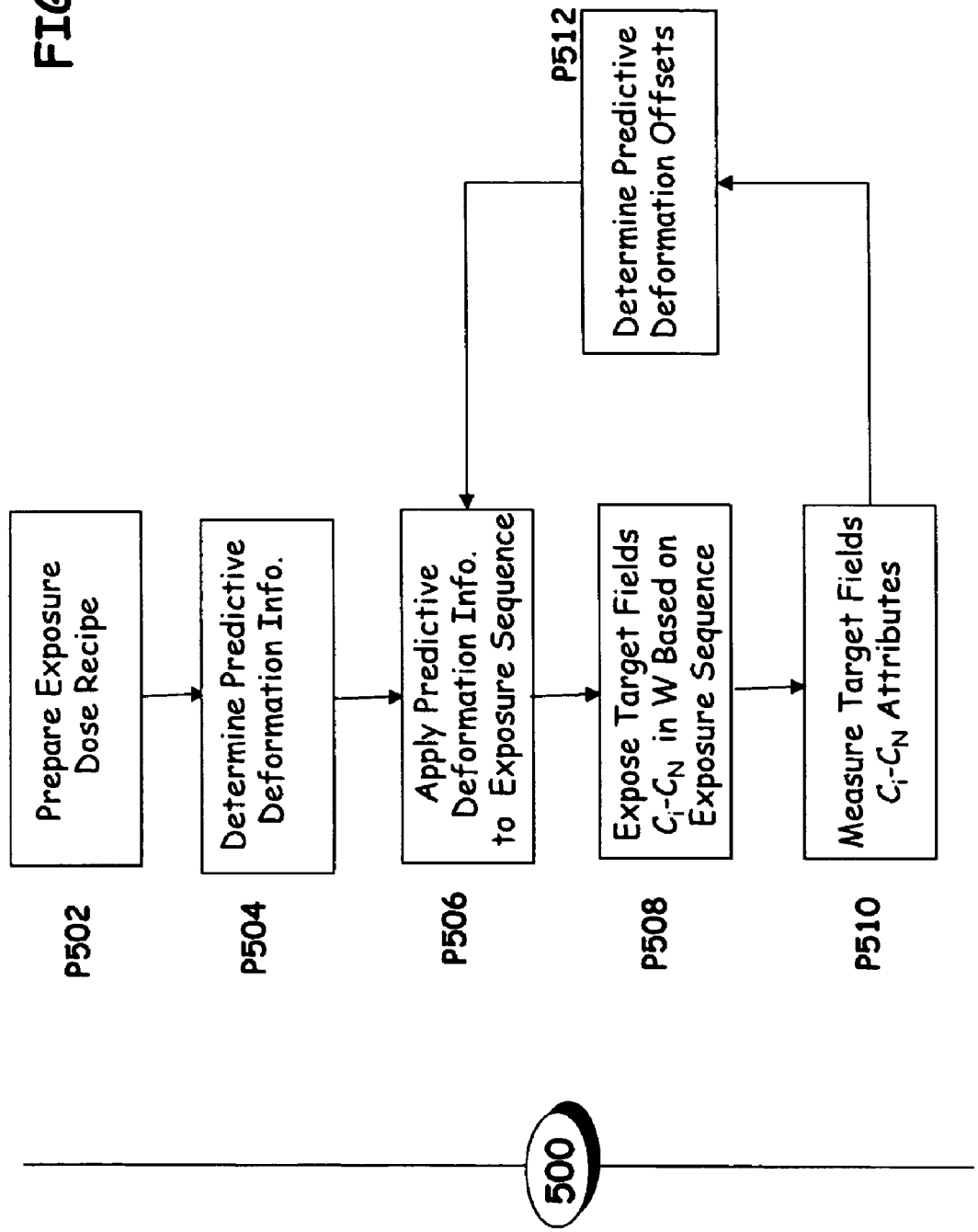
FIGS. 5A-5B illustrate a schematic functional flow diagram depicting another embodiment of the present invention.

FIG. 5A schematically depicts the general inventive concept of thermal correction process 500, constructed and operative in accordance with a particular embodiment of the present invention. As indicated in FIG. 4A, correction process 500 commences with procedure task P502, which provides the initial exposure recipe. As discussed above with respect to the other disclosed embodiments, the exposure recipe designates the amount of energy to be focused by the projection beam PB onto each of the target fields $C_i$-$C_N$ of the wafer substrate W to comply with the manufacturer's specified features and profile of the exposed pattern. The exposure recipe also includes associated exposure position information that identifies the pre-specified coordinates at which the projection beam PB is to be focused for each target fields $C_i$-$C_N$ as well as associated exposure sequence information that identifies the pre-specified sequence in which each of the target fields $C_i$-$C_N$ are to be exposed by projection beam PB.

Thermal correction process 500 then advances to procedure task P504, where thermal corrections are determined. In this embodiment, the thermal corrective information takes the form of exposure sequencing information based on predictive deformation information. In particular, any of the predictive models discussed above, such as, for example, the calculated deformation information based on equations (1), (2), (4a), (4b) may be used to predict how the target fields $C_i$-$C_N$ would respond to exposures based on the initial exposure information, including exposure sequence, as provided by the exposure recipe.

Thermal correction process 500 then advances to procedure task P506, where the set of calculated predictive deformation information is applied to the exposure information of the exposure recipe to compensate for the predicted deformations. That is, by knowing how the thermal effects deform the target fields $C_i$-$C_N$ across the wafer substrate W, given an initial exposure sequence, the predicted deformation information may be used to adjust the sequence in which the target fields $C_i$-$C_N$ are exposed.

Figure 5B:
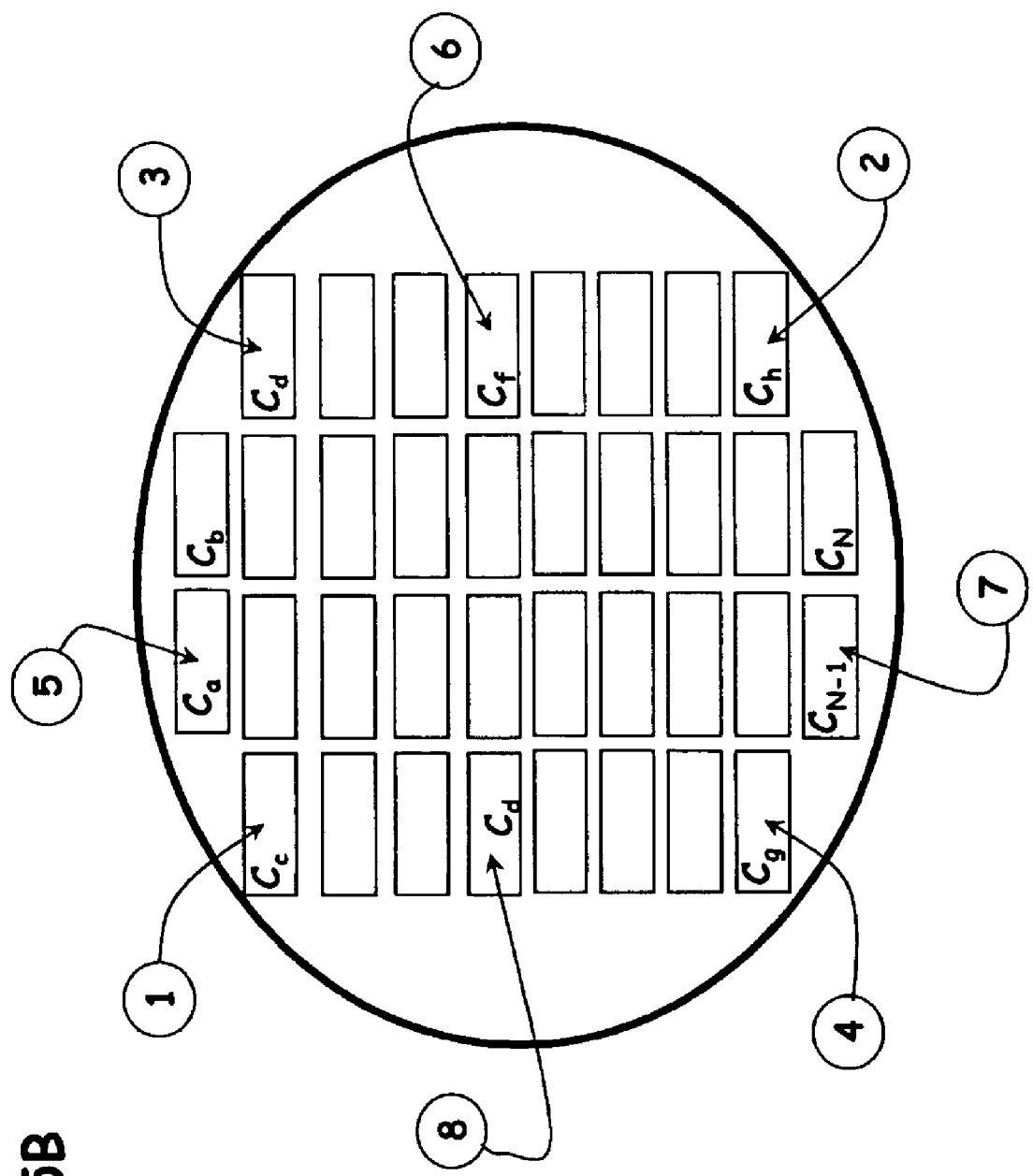

For example, as illustrated in FIG. 5B, thermal correction process 500 may determine, based on the set of calculated predictive deformation information, that for wafer substrate W, exposing target fields $C_i$-$C_N$ in the following sequence will minimize thermal effects and improve the average field corrections: $C_c \rightarrow C_h \rightarrow C_d \rightarrow C_g \rightarrow C_a \rightarrow C_f \rightarrow C_{N-1} \rightarrow C_d \rightarrow \ldots$ etc.

After applying the predictive deformation information, process 500 in procedure task P508, successively exposes each of the target fields with the desired pattern via lithographic apparatus 100, 150, in a manner consistent with the description above and in accordance with the exposure sequence based on the predictive deformation information.

After exposure, correction process 500 then progresses to procedure task P510, where the exposed wafer substrate W is subjected to a measurement process. The measurement process is configured to measure various attributes and artifacts of the target fields $C_i$-$C_N$ and/or wafer substrate W that evince wafer heating effects. As discussed above, such measured attributes may include, for example, the size of the individual target fields C, specific test patterns, layer dependent alignment marks, gaps between target field C features, X and/or Y diameter of target fields holes and/or posts, etc. and may be performed by mechanisms internal to lithographic exposure apparatus 100, 150, or by external devices.

Based on the measured attributes of the exposed target fields $C_i$-$C_N$ in procedure task P512, thermal correction process 500 determines offset information to revise the exposure sequence information. That is, armed with the measured attribute information, the exposure sequence may be further improved by re-calculating the predictive model to generate an updated set of predictive deformations or by adjusting the sequence based on distribution of the measured attributes on the wafer substrate W. Process 500 may be iterated several times until the exposed patterns achieve the features and profile specified by manufacturer.

Sixth Embodiment

FIG. 6 schematically depicts the general inventive concept of thermal correction process 600, constructed and operative in accordance with a particular embodiment of the present invention. As indicated in FIG. 6, correction process 600 commences with procedure task P602, which provides the initial exposure recipe. As discussed above with respect to the other disclosed embodiments, the exposure recipe may include exposure time, exposure energy, exposure coordinate positioning, and exposure sequencing information.

Thermal correction process 600 then advances to procedure task P604, where thermal corrections are determined. In this embodiment, the thermal corrective information takes the form of deformation information based on the acquisition of temperature information. In particular, a thermographic image of wafer substrate W is made, for instance with an infrared thermographic camera as sensor, to obtain a temperature map of its surface. The regional temperature variance information is then converted to a set of deformation information (i.e., deformation map) for the target fields $C_i$-$C_N$ based on the following models:

$$[dx]_p = \left[ c \frac{x_i}{r_w} \frac{1}{N_i} \sum_k (T_k - T_{nom}) \right]; \text{ and} \quad (8a)$$

$$[dy]_p = \left[ c \frac{y_i}{r_w} \frac{1}{N_i} \sum_k (T_k - T_{nom}) \right]; \text{ where} \quad (8b)$$

$dx_p$: represents the predicted deformation along the x axis;
$x_i$: represents the x coordinate of field i;
c: represents a proportionality constant (thermal expansion coefficient);
$N_i$: represents the number of fields taken into account in the summation;
k: sums over the relevant fields, along the connection line between the wafer centre and field i;
$T_k$: represents the measured temperature of field k;
$T_{nom}$: represents the nominal temperature for which the machine is set up;
$y_i$: represents the y coordinate of field i; and
$dy_p$: represents the predicted deformation along the y axis.

Thermal correction process 600 then advances to procedure task P606, where the deformation map is applied to the exposure information of the exposure recipe to compensate for the predicted deformations. That is, by knowing how the thermal effects deform the target fields $C_i$-$C_N$ across the wafer substrate W, given the wafer substrate temperature variations, the deformation information may be used to adjust parameters of the exposure process, including, for example, exposure time, exposure energy, exposure coordinate positioning, and exposure sequencing information, etc.

After applying the predictive deformation information, process 600 in procedure task P608, successively exposes each of the target fields with the desired pattern via lithographic apparatus 100, 150, in a manner consistent with the description above and in accordance with the exposure information based on the deformation information.

After exposure, correction process 600 then progresses to procedure task P610, where the exposed wafer substrate W is subjected to a measurement process. The measurement process is configured to measure various attributes and artifacts of the target fields $C_i$-$C_N$ and/or wafer substrate W that evince wafer heating effects. As discussed above, such measured attributes may include the size of the individual target fields C, specific test patterns, layer dependent alignment marks, gaps between target field C features, etc. and may be performed by mechanisms internal to lithographic exposure apparatus 100, 150, or by external devices.

Also a post-exposure thermographic image can be made to establish the temperature differences of the target fields $C_i$-$C_N$ and/or wafer substrate W after the exposures. The temperature differences can be used to estimate the temperature distribution while the exposures are being done.

When the temperature differences are not varying gradually, i.e. hot-spots are found, it is likely that poor thermal contact between wafer substrate and wafer table exists. As this could point to contamination of the wafer or the wafer table, so the measurement of the temperature differences can be used to detect contamination.

Based on the measured attributes of the exposed target fields $C_i$-$C_N$ in procedure task P612, thermal correction process 600 determines offset information to revise the deformation information map. Having the measured attribute information, the deformation information map be revised and updated to reflect the distribution of the measured attributes. This revised deformation information may then be used to further adjust exposure parameters, including, for example, exposure energies, exposure times, exposure sequencing, exposure coordinate information, etc. Process 600 may be iterated several times until the exposed patterns achieve the features and profile specified by manufacturer.

Whilst specific embodiments of the invention have been described above, it will be appreciated that the invention may be practiced otherwise than as described. The embodiments described above may, instead, be implemented in different embodiments of software, firmware, and hardware in the entities illustrated in the figures. For example, some of the disclosed procedure tasks may be performed by the exposure tool controller or, in the alternative, by a processing device dedicated for such purposes.

As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A lithographic system, comprising:
   a support structure configured to support a patterning device, the patterning device configured to impart a beam of radiation with a pattern in its cross-section;
   a substrate holder configured to hold a substrate, the substrate comprising a plurality of target fields;
   a projection system configured to expose the patterned beam onto at least one of the target fields of the substrate, the at least one exposed target field being exposed in accordance with pre-specified exposure information; and
   a measurement station configured to measure an attribute of the at least one exposed target field, the at least one exposed target field being measured by the measurement station to assess deformation of the at least one exposed field induced by thermal effects of the exposure; and
   a controller configured to determine corrective information based on the measured field deformation and to adjust the pre-specified exposure information, based on the corrective information, to compensate for the thermally-induced field deformation, wherein the exposure information includes exposure energy information, or exposure time information, or both.

2. A lithographic system, comprising:
a support structure configured to support a patterning device, the patterning device configured to impart a beam of radiation with a pattern in its cross-section;
a substrate holder configured to hold a substrate, the substrate comprising a plurality of target fields;
a projection system configured to expose the patterned beam onto at least one of the target fields of the substrate, the at least one exposed target field being exposed in accordance with pre-specified exposure information; and
a measurement station configured to measure an attribute of the at least one exposed target field, the at least one exposed target field being measured by the measurement station to assess deformation of the at least one exposed field induced by thermal effects of the exposure; and
a controller configured to determine corrective information based on the measured field deformation and to adjust the pre-specified exposure information, based on the corrective information, to compensate for the thermally-induced field deformation,
wherein the controller comprises a global expansion model to predict thermally-induced field deformation, and is configured to modify the pre-specified exposure information, prior to exposure, based on the predicted thermally-induced field deformation information, and
wherein the predicted thermally-induced field deformation information includes predicted deformation effects of selected points within each of the fields based on the global expansion model.

3. The lithographic system of claim 1, wherein the pre-specified exposure information adjustment includes adjustment of the pre-specified exposure field position information based on position offset information determined by the corrective information.

4. The lithographic system of claim 1, further comprising a model to predict thermally-induced field deformation information, and configured to modify the pre-specified exposure information, prior to exposure, based on the predicted thermally-induced field deformation information.

5. The lithographic system of claim 2, wherein the exposure information includes (i) exposure energy information, or (ii) exposure time information, or (iii) exposure field position information, or (iv) exposure field sequencing information, or (v) exposure field deformation information, or (vi) any combination from (i) to (v).

6. The lithographic system of claim 2, wherein the predictive model is based on:

$$[dx]_p = \left[\frac{x}{r_w} \cdot \frac{N_i}{N_{tot}} \cdot dx_{max}\right]; \text{ and}$$

$$[dy]_p = \left[\frac{y}{r_w} \cdot \frac{N_i}{N_{tot}} \cdot dy_{max}\right]; \text{ where}$$

$dx_p$: represents the predicted deformation along the x axis;
$dx_{max}$: represents the predicted total deformation of the substrate in the x direction after the last target field has been exposed;
x: represents the x coordinate of a point on the substrate;
$r_w$: represents the radius of the substrate;
$N_i$: represents the current target field index number;
$N_{tot}$: represents the total number of target fields;
$dy_{max}$: represents the predicted deformation along the y axis;
$dy_{max}$: represents the predicted total deformation of the substrate in the y direction after the last target field has been exposed; and
y: represents the y coordinate of a point on the substrate.

7. The lithographic system of claim 6, wherein the pre-specified exposure information adjustment includes adjustment of the exposure field sequencing information based on the predicted thermally-induced field deformation information.

8. A lithographic system, comprising:
a support structure configured to support a patterning device, the patterning device configured to impart a beam of radiation with a pattern in its cross-section;
a substrate holder configured to hold a substrate, the substrate comprising a plurality of target fields;
a projection system configured to expose the patterned beam onto at least one of the target fields of the substrate, the at least one exposed target field being exposed in accordance with pre-specified exposure information; and
a measurement station configured to measure an attribute of the at least one exposed target field, the at least one exposed target field being measured by the measurement station to assess deformation of the at least one exposed field induced by thermal effects of the exposure; and
a controller configured to determine corrective information based on the measured field deformation and to adjust the pre-specified exposure information, based on the corrective information, to compensate for the thermally-induced field deformation,
wherein the controller comprises a model to predict thermally-induced field deformation, and is configured to modify the pre-specified exposure information, prior to exposure, based on the predicted thermally-induced field deformation information, and
wherein the thermally-induced field deformation information includes predicted deformation effects of selected points within each of the fields of the substrate based on a time-decaying characteristic as energy is transported across the substrate.

9. The lithographic system of claim 8, wherein the predictive model is based on:

$$dx_p = \Sigma_i T_i^x D_i^x; \text{ and}$$

$$dy_p = \Sigma_i T_i^y D_i^y; \text{ where}$$

$dx_p$: represents predicted deformation along the x axis;
$dy_p$: represents predicted deformation along the y axis;

$$T_i = e^{\frac{t-t_i}{\tau}}:$$

represents thermal effects of exposing one of the target fields $C_i$ which will decay in time t as energy is transported across the substrate in either the x or y direction;
$\tau$: represents the time sensitivity constant which depends on the thermal properties of the lithographic exposure components;
$D_i = k e^{-|\vec{r}_i - \vec{r}|/\chi}$: represents effects induced by a distance $r_i$ between the exposed target field $C_i$ and a target field to be currently exposed in either the x or y direction;

χ: represents the spatial thermal properties of the lithographic exposure components; and k: represents a proportionality constant which depends on thermal properties of the lithographic exposure components.

10. The lithographic system of claim 9, wherein the pre-specified exposure information adjustment includes adjustment of the exposure field sequencing information based on the predicted thermally-induced field deformation information.

11. A lithographic system, comprising:

a support structure configured to support a patterning device, the patterning device configured to impart a beam of radiation with a pattern in its cross-section;

a substrate holder configured to hold a substrate, the substrate comprising a plurality of target fields;

a projection system configured to expose the patterned beam onto at least one of the target fields of the substrate, the at least one exposed target field being exposed in accordance with pre-specified exposure information; and a measurement station configured to measure an attribute of the at least one exposed target field, the at least one exposed target field being measured by the measurement station to assess deformation of the at least one exposed field induced by thermal effects of the exposure; and a controller configured to determine corrective information based on the measured field deformation and to adjust the pre-specified exposure information, based on the corrective information, to compensate for the thermally-induced field deformation, wherein the measurement station is configured to measure temperature variations on a surface of the substrate prior to exposure, and configured to generate a deformation map based on the measured substrate temperature variations.

12. The lithographic system of claim 11, wherein the controller is further configured to modify the pre-specified exposure information, prior to exposure, based on the deformation map.

13. The lithographic system of claim 11, wherein the temperature variation measurement includes thermographic imaging.

14. The lithographic system of claim 11, wherein the deformation map is characterized by:

$$[dx]_p = \left[ c \frac{x_i}{r_w} \frac{1}{N_i} \sum_k (T_k - T_{nom}) \right];$$

$$[dy]_p = \left[ c \frac{y_i}{r_w} \frac{1}{N_i} \sum_k (T_k - T_{nom}) \right]; \quad \text{where}$$

$dx_p$: represents the predicted deformation along the x axis;

$x_i$: represents the x coordinate of field i;

$r_w$: represents the radius of the substrate;

c: represents a proportionality constant (thermal expansion coefficient);

$N_i$: represents the number of fields taken into account in the summation;

k: sums over the relevant fields, along the connection line between the substrate center and field i;

$T_k$: represents the measured temperature of field k;

$T_{nom}$: represents the nominal temperature for which the lithographic system is set up;

$y_i$: represents the y coordinate of field i; and $dy_p$: represents the predicted deformation along the y axis.

15. The lithographic system of claim 12, wherein the pre-specified exposure information adjustment includes adjustment of the modified pre-specified exposure information, after the exposure, based on deformation offset information determined by the corrective information.

* * * * *